US011362023B2

(12) United States Patent
Narayanasamy et al.

(10) Patent No.: US 11,362,023 B2
(45) Date of Patent: Jun. 14, 2022

(54) PACKAGE LEAD DESIGN WITH GROOVES FOR IMPROVED DAMBAR SEPARATION

(71) Applicant: Infineon Technologies AG, Neubiberg (DE)

(72) Inventors: Jayaganasan Narayanasamy, Melaka (MY); Meng How Chong, Melaka (MY); Elmer Senorin Holgado, Melaka (MY); Chee Ming Lam, Melaka (MY); Sanjay Kumar Murugan, Melaka (MY); Arivindran Navaretnasinggam, Melaka (MY); Kai Yang Tan, Selangor (MY); Lee Shuang Wang, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 41 days.

(21) Appl. No.: 16/510,448

(22) Filed: Jul. 12, 2019

(65) Prior Publication Data
US 2021/0013135 A1    Jan. 14, 2021

(51) Int. Cl.
*H01L 23/495*    (2006.01)
*H01L 21/48*     (2006.01)
*H01L 21/56*     (2006.01)
*H01L 23/31*     (2006.01)

(52) U.S. Cl.
CPC .... *H01L 23/49548* (2013.01); *H01L 21/4842* (2013.01); *H01L 21/56* (2013.01); *H01L 23/3107* (2013.01); *H01L 23/49565* (2013.01); *H01L 23/49582* (2013.01)

(58) Field of Classification Search
CPC ........ H01L 23/49548; H01L 23/49565; H01L 21/4842; H01L 21/56; H01L 23/3107; H01L 23/49582; H01L 2224/48091; H01L 2924/181; H01L 2224/0603; H01L 2224/49111; H01L 2224/97; H01L 2224/48247; H01L 21/561; H01L 23/49562; H01L 23/49541
See application file for complete search history.

(56) References Cited

U.S. PATENT DOCUMENTS

| | | | | |
|---|---|---|---|---|
| 2012/0108013 | A1* | 5/2012 | Fujisawa | H01L 21/52 438/123 |
| 2012/0181676 | A1* | 7/2012 | Tsui | H01L 23/60 257/675 |
| 2014/0327122 | A1* | 11/2014 | Jeon, II | H01L 23/49541 257/670 |
| 2019/0051585 | A1* | 2/2019 | Dimaano, Jr. | H01L 23/3121 |
| 2019/0067172 | A1* | 2/2019 | Carpenter | H01L 23/49548 |

* cited by examiner

*Primary Examiner* — Benjamin Tzu-Hung Liu
(74) *Attorney, Agent, or Firm* — Murphy, Bilak & Homiller, PLLC

(57) ABSTRACT

A lead frame includes a die pad, a first lead extending away from the die pad, a peripheral structure mechanically connected to the first lead and the die pad, and a first groove in an outer surface of the first lead. The first groove extends longitudinally along the first lead away from the die pad.

17 Claims, 10 Drawing Sheets

PACKAGE LEAD DESIGN WITH GROOVES FOR IMPROVED DAMBAR SEPARATION

BACKGROUND

One common type of semiconductor package is a molded package. These packages typically include a conductive lead frame that includes a die pad and several elongated leads extending away from the die pad. One or more semiconductor dies are mounted on the die pad and electrically connected to the individual leads of the lead frame, e.g., using conductive bond wires, metal clips, etc. An encapsulant, e.g., plastic, ceramic, etc., is molded around the semiconductor die and associated electrical connections. The encapsulant protects the semiconductor die and electrical connections from damaging environmental conditions, such as moisture, foreign particles, etc. Portions of the leads that are exposed from the encapsulant can interface with another device, such as a printed circuit board.

Molded packages are typically formed by an injection process whereby the semiconductor die is placed in a mold cavity and liquified molding compound is injected into the mold cavity. Injection molding processes suffer from various drawbacks that create reliability issues and detrimentally impact yield of the final product.

SUMMARY

A lead frame is disclosed. According to an embodiment, the lead frame comprises a die pad, a first lead extending away from the die pad, a peripheral structure mechanically connected to the first lead and the die pad; and a first groove in an outer surface of the first lead, the first groove extending longitudinally along the first lead away from the die pad.

Separately or in combination, the outer surface of the first lead comprises first and second surfaces that are generally planar and extend longitudinally along the first lead, the first and second surfaces are angled relative to one another, and the first groove forms a transition between the first and second surfaces.

Separately or in combination, the outer surface of the first lead further comprises a third surface that is generally planar and extends longitudinally along the first lead between the first and second ends, the second and third surfaces are angled relative to one another, wherein the lead frame further comprises a second groove in an outer surface of the first lead, the second groove extending longitudinally along the first lead away from the die pad, and the second groove forms a transition between the second and third surfaces.

Separately or in combination, the outer surface of the first lead further comprises a fourth surface that is generally planar and extends longitudinally along the first lead between the first and second ends, the third and fourth surfaces are angled relative to one another, the fourth and first surfaces are angled relative to one another, the lead frame further comprises a third and fourth grooves in an outer surface of the first lead, the third and fourth grooves extending longitudinally along the first lead, the third groove forms a transition between the third and fourth surfaces, and the fourth groove forms a transition between the fourth and first surfaces.

Separately or in combination, the groove comprises first and second sidewalls that extend into the first lead, and the first and second sidewalls form an angled intersection with one another.

Separately or in combination, the lead frame further comprises a second lead extending away from the die pad, a fifth groove in an outer surface of the second lead, the fifth groove extending longitudinally along the second lead away from the die pad, wherein the peripheral structure comprises an inner dam bar that extends transversely to and connects with longitudinal edge sides of the first and second leads, and wherein the first and fifth grooves longitudinally extend between the inner dam bar and a location that is closer to the die pad.

Separately or in combination, the peripheral structure comprises a lead frame rail that extends transversely to and connects with longitudinal edge sides of the first and second leads, the lead frame rail is further away from the die pad than the inner dam bar, inner portions of the leads disposed between the die pad and the inner dam bars have a first thickness, and outer portions disposed between the inner dam bars and the lead frame rails have a second thickness that is less than the first thickness.

A method of packaging a semiconductor device is disclosed. According to an embodiment, the method comprises providing a lead frame that comprises a die pad, a first lead extending away from the die pad, a peripheral structure mechanically connected to the first lead and the die pad, and a first groove in an outer surface of the first lead, the first groove extending longitudinally along the first lead away from the die pad.

Separately or in combination, the outer surface of the first lead comprises first and second surfaces that are generally planar and extend longitudinally along the first lead, wherein the first and second surfaces are angled relative to one another, and the first groove forms a transition between the first and second surfaces.

Separately or in combination, the method further comprises mounting a semiconductor die on the die pad, and encapsulating the semiconductor die with an electrically insulating encapsulant body, and the electrically insulating encapsulant body is formed such that an outer sidewall that is disposed over an extends transversely to the first groove.

Separately or in combination, the lead frame further comprises a second lead extending away from the die pad, and a fifth groove in an outer surface of the second lead, the fifth groove extending longitudinally along the second lead, the peripheral structure comprises an inner dam bar that extends transversely to and connects with longitudinal edge sides of the first and second leads, the first and fifth grooves longitudinally extend between the inner dam bar and a location that is closer to the die pad, and the outer sidewall intersects the first and second leads at a location that is between the inner dam bars and the die pad.

Separately or in combination, encapsulating the semiconductor die comprises a molding process, and the molding process forms mold compound that extends past the outer sidewall of the encapsulant body and towards the inner dam bars in the first and fifth grooves.

Separately or in combination, the method further comprises performing a plating process that covers upper surfaces of the first and second leads with a conductive plating material after the molding process, and performing a punching process that removes the inner dam bar after performing the plating process.

Separately or in combination, the first and fifth grooves substantially prevent the conductive plating formed on the first and second leads from reaching lateral outer sides of the first and second leads during the plating process.

A semiconductor package is disclosed. According to an embodiment, the semiconductor package comprises a die pad, a first lead that extends away from the die pad and comprises a first groove in an outer surface of the first lead, the first groove extending longitudinally along the first lead away from the die pad, a semiconductor die mounted on the die pad; and an encapsulant body of electrically insulating mold compound. The encapsulant body is formed such that the semiconductor die and an inner portion of the first lead are encapsulated by the encapsulant body, an outer portion of the first lead is exposed from the encapsulant body, and a longitudinal section of the first lead that includes the first groove protrudes out of an outer sidewall of the encapsulant body.

Separately or in combination, the outer surface of the first lead comprises first and second surfaces that are generally planar and extend longitudinally along the first lead, the first and second surfaces are angled relative to one another, and the first groove forms a transition between the first and second surfaces.

Separately or in combination, the encapsulant body comprises a main volume and a lead sleeve, wherein the lead sleeve extends out of the edge side of the main volume and completely surrounds the lead, and wherein the longitudinal section of the first lead protrudes out of the lead sleeve.

Separately or in combination, the encapsulant body comprises a main volume comprising a substantially planar edge side that extends between upper and lower surfaces, and wherein the longitudinal section of the lead protrudes directly out of the planar edge side.

Separately or in combination, a portion of the mold compound is formed outside of the outer sidewall in the groove.

Separately or in combination, the outer surface of the first lead further comprises a second groove in an outer surface of the first lead, the second groove extending longitudinally along the first lead away from the die pad, wherein the first and second grooves are separated from one another by the second surface, wherein a portion of the mold compound is formed outside of the outer sidewall in the first and second grooves, and wherein the second surface that is outside of the outer sidewall is substantially devoid of the mold compound.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein include a lead frame design that advantageously prevents fritters from forming on the sides of package leads as a result of the molding process. These fritters are small protrusions of plating material that branch away from the leads. In some cases, these fritters can cause electrical shorts or other reliability issues. The fritters may be caused by unwanted formation of mold compound on the leads. The lead frame design advantageously includes grooves that accommodate mold compound and thus prevent the formation of conductive fritters. Specifically, the lead frame includes grooves formed in one or more leads. The grooves are formed at least in the interior portions of the leads that are between the die pad and inner dam bars. The grooves extend longitudinally along the leads, i.e., in a current flow direction of the leads. During an encapsulation process wherein the lead frame is placed in a mold cavity and liquified molding material is injected therein, the grooves receive a substantial majority of any mold compound that escapes the mold cavity. Hence, any mold compound that escapes the cavity fills the grooves. The mold compound formed on the leads is less susceptible to cracking or tearing during subsequent processing of the lead frame, e.g., during a dam bar punching process, which in turn mitigates the possibility of conductive fritters forming.

Figure 1:
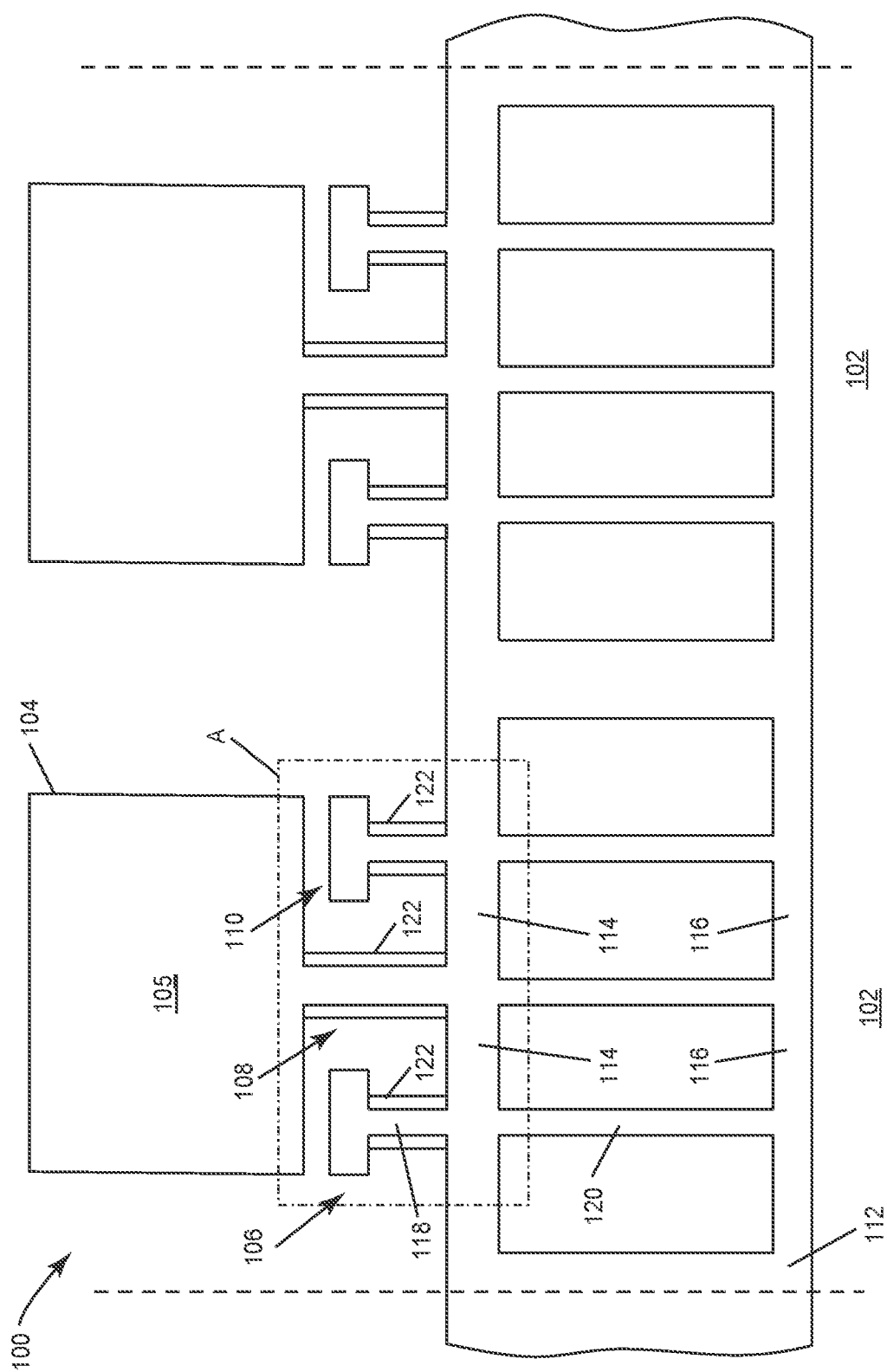
FIG. 1 illustrates a lead frame with grooves formed in outer surfaces of the leads, according to an embodiment.

Referring to FIG. 1, a lead frame 100 that is used to form a packaged semiconductor device is depicted, according to an embodiment. The lead frame 100 is provided from a lead frame strip that includes a plurality of identically configured unit lead frames 102, two of which are depicted in FIG. 1. The features of the lead frame 100 described herein are electrically and thermally conductive. Exemplary materials for the lead frame 100 include metals such as copper (Cu) Nickel, (nickel phosphorous) NiP, silver (Ag), palladium (Pd)_gold (Au), etc., alloys or combinations thereof. According to one technique, the lead frame 100 is provided by a sheet of metal, and the various features are formed by performing techniques such as stamping, punching, etching, bending, etc., on this planar sheet of metal.

The lead frame 100 includes a die pad 104. The die pad 104 includes a generally planar die attach surface 105 that is dimensioned to accommodate one or more semiconductor dies. As depicted, the die pad 104 has a generally rectangular shape. More generally, the die pad 104 can have a variety of geometries.

The lead frame 100 additionally includes a plurality of leads two or more leads). Each of the leads extend away the die pad 104. As shown, the lead frame 100 includes first, second and third leads, 106, 108, 110 each extending away from an edge side of the die pad 104. The first and third leads 106, 110 are physically spaced apart from the first side of the die pad 104. Moreover, the first and third leads 106, 110 include enlarged bonding regions for the attachment of electrical connectors, e.g., bond wires. The second lead 108 directly attaches to an edge side of the die pad 104. More generally, the number, geometry and arrangement of the leads may differ from what is shown.

The lead frame 100 additionally includes a peripheral structure 112. The peripheral structure 112 is a handling feature for supporting and moving the lead frame 100 through the various processing tools to form a semiconductor package, e.g., die attach, wire bonding, encapsulation, etc. The peripheral structure 112 provides a mechanical connection between the die pad 104 and each of the leads. In the depicted embodiment, the peripheral structure 112 is disposed only on one side of the die pad 104, and the mechanical connection between the peripheral structure 112 and the die pad 104 is provided by the second lead 108. More generally, the peripheral structure 112 can have a variety of different configurations, and the connection between the peripheral structure 112 and the die pad 104 can have a variety of different configurations. For example, in other embodiments, the peripheral structure 112 has a ring-shape, with the die pad 104 centrally located inside of the ring. In this case, the die pad 104 can be connected to the peripheral structure 112 by leads and/or by dedicated tie bar structures.

The peripheral structure 112 includes dam bars. The dam bars extend transversely to the leads. That is, the dam bars extend in a direction that is transverse (e.g., perpendicular) to the longitudinal direction of the leads. The dam bars connect with longitudinal edge sides of each lead, and hence form a mechanical connection between the leads. In the depicted embodiment, the peripheral structure 112 includes inner dam bars 114 and lead frame rails 116 that are further away from the die pad 104 than the inner dam bars 114. The lead frame rails 116 are the supporting frame for each lead frame strip.

According to an embodiment, the leads have different thickness. For example, as shown, inner portions 118 of the leads that are disposed between the die pad 104 and the inner dam bars 114 have a first thickness between opposing longitudinal edge sides, and outer portions 120 of the leads which extend between the inner dam bars 114 and the lead frame rails 116 have a second thickness between opposing longitudinal edge sides that is less than the first thickness, e.g., about half of the first thickness or lower. More generally, the outer portions 120 of the leads can have anywhere between one half and two times the thickness of the inner 118 portions of the leads.

According to an embodiment, the lead frame 100 is configured such that at least one of the leads includes a groove 122 in an outer surface. Generally speaking, a groove 122 refers to an intentionally formed depression in the lead, with identifiable sidewalls that extend inwardly from the outer surface of the lead towards a cross-sectional center of the lead. Hence, in contrast to a typical lead configuration that includes exclusively planar surfaces, the leads of this lead frame 100 have contoured surfaces. The grooves 122 can be formed according to a variety of techniques such as stamping, etching, etc.

Figure 2:
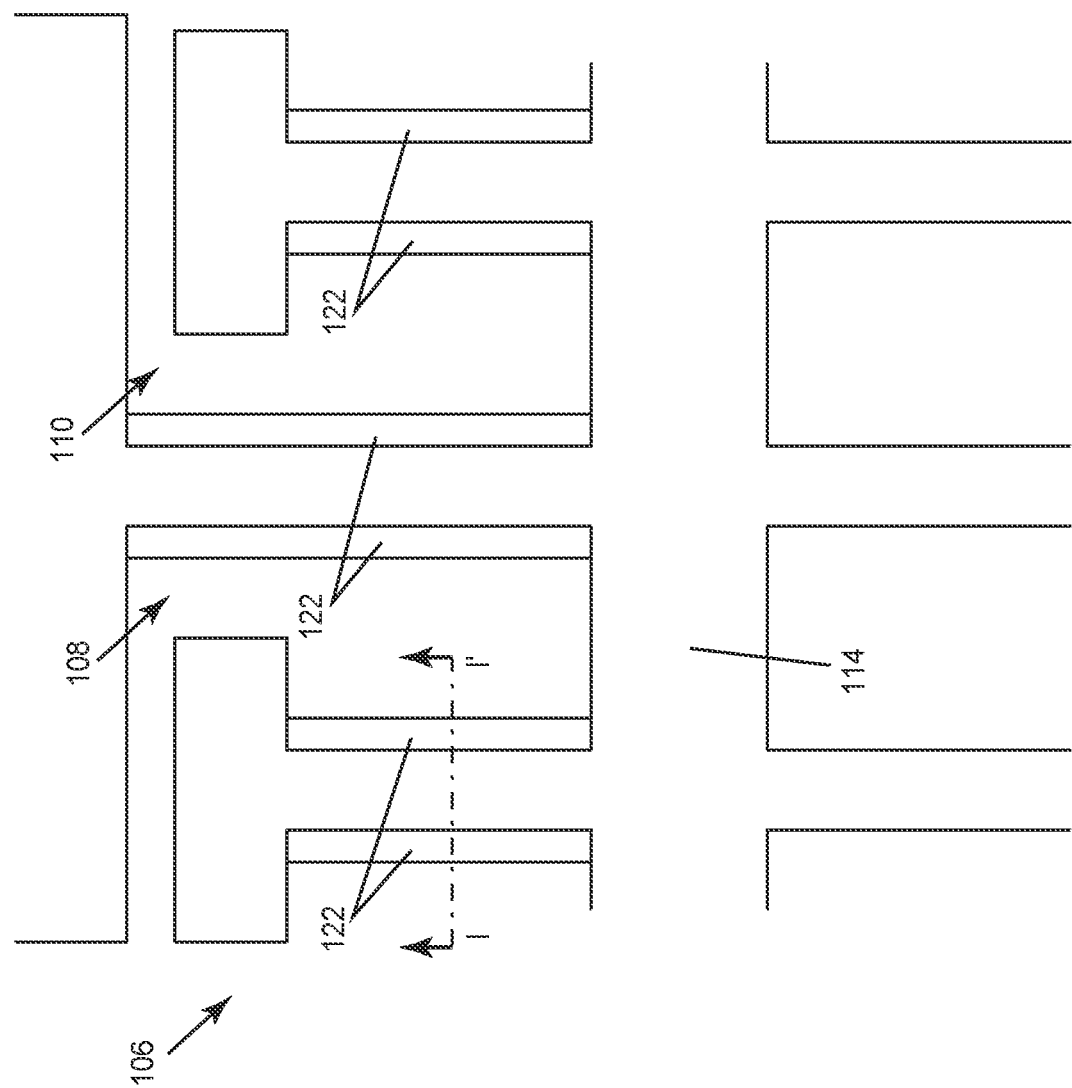
FIG. 2 illustrates a close-up view of the lead frame in the area A identified in FIG. 1, according to an embodiment.

Referring to FIG. 2, a close-up view of the lead frame 100 is shown. In this embodiment, the grooves 122 are formed in each of the first, second and third leads 106, 108, 110. These grooves 122 extend longitudinally along the respective lead in which they are formed in. As used herein, the longitudinal direction of the leads refers to a current flow direction of the leads, i.e., a direction that moves towards and away from the die pad 104. The grooves 122 are elongated depressions in the leads, wherein the direction of elongation is parallel to the longitudinal direction of the leads. For example, as shown, the grooves 122 extend along the leads parallel to the longitudinal edge sides of the leads.

According to an embodiment, the grooves 122 are formed only along a partial length of the leads. For example, as shown, the grooves 122 are only formed along the inner (thicker) portions 118 of the leads. More particularly, as shown, the grooves 122 in the first and third leads 106, 110 extend from the inner dam bars 114 to a location that is closer to the die pad 104. The grooves 122 in the second lead 108 extend completely from the inner dam bars 114 to the die pad 104. According to an embodiment, the outer (thinner) portions 120 of the leads do not include the grooves 122.

Figure 3:
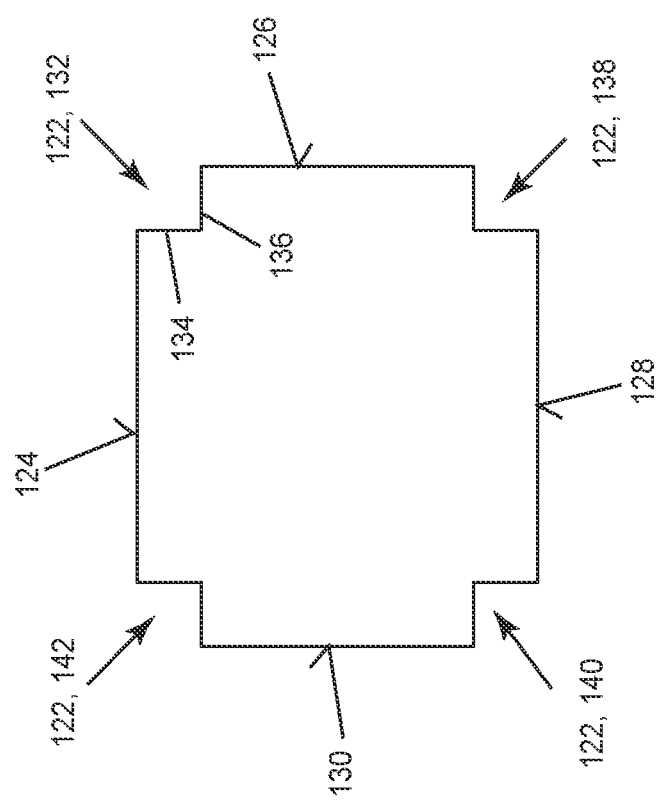
FIG. 3 illustrates a cross-sectional view of the lead frame along the line I-I' identified in FIG. 2, according to an embodiment.

Referring to FIG. 3, a cross-sectional configuration of the first lead 106 is shown, according to an embodiment. The outer surface of the first lead 106 comprises first and second surfaces 124, 126. The first and second surfaces 124, 126 are generally planar and extend longitudinally along the first lead 106. The first and second surfaces 124, 126 are angled relative to one another. This means that, from the cross-sectional perspective of FIG. 2, the first and second surfaces 124, 126 extend along non-parallel places planes that intersect with one another. The outer surface of the first lead 106 additionally includes third and fourth surfaces 128, 130 that are generally planar and extend longitudinally along the first lead 106 in a similar manner as described above. In a similar manner, the second and third surfaces 126, 128 are angled relative to one another, the third and fourth surfaces 128, 130 are angled relative to one another, and the fourth and first surfaces 130, 124 are angled relative to one another.

According to an embodiment, the first and second surfaces 124, 126 extend along substantially perpendicular planes, such that the first and second surfaces 124, 126 are substantially orthogonal to one another. Likewise, the second and third surfaces 126, 128 extend along substantially perpendicular planes, and so-forth such that the first, second, third and fourth surfaces 124, 126, 128, 130 extend along places corresponding to the sides of a rectangle. More generally, the outer surface of the first lead 106 can have a variety of geometries, including tapered geometries, curved transitions, and surfaces that extend along non-perpendicular intersecting planes.

A first one 132 of the grooves 122 forms a transition between the first and second surfaces 124, 126. This means that the first groove 132 is formed at a location wherein the plane of the first surface 124 intersects the plane of the second surface 126. As shown in FIG. 3, the first groove 132 is disposed at a corner location of the first lead 106, and the first groove 132 provides a step-shaped transition between the first and second surfaces 124, 126. Moreover, the first groove 132 includes first and second side ails 134, 136 that respectively intersect the first and second surfaces 124, 126. In one particular embodiment, the first and second sidewalls 134, 136 each have a length of at least 50 μm, e.g., about 100 μm. More generally, the first and second sidewalls 134, 136 can have a length of between 5 μm and 200 μm or more. The first and second sidewalls 134, 136 form an angled intersection with another. In the depicted embodiment, the first and second sidewalls 134, 136 form a perpendicular intersection with one another. More generally, the first and second sidewalls 134, 136 can be disposed at a variety of different angles relative to one another.

According to an embodiment, the first lead 106 includes more than one of the grooves 122. For example, as shown, the first lead 106 includes a second one 138 of the grooves 122 that forms a transition between the second and third surfaces 126, 128, a third one 140 of the grooves 122 that forms a transition between the third and fourth surfaces 128, 130, and fourth one 142 of the grooves 122 that forms a transition between the fourth and first surfaces 130, 124. Each of the second, third and fourth grooves 138, 140, 142 has a similar configuration as the first groove 132 as previously described.

Figure 4:
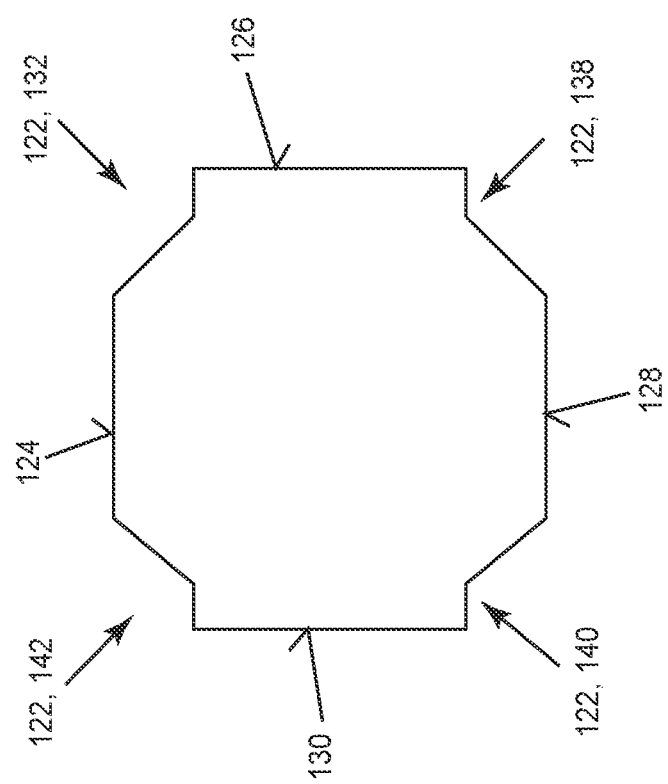
FIG. 4 illustrates a cross-sectional view of the lead frame along the line I-I' identified in FIG. 2, according to another embodiment.

Referring to FIG. 4, a cross-sectional groove configuration of the first lead 106 is shown, according to another embodiment. The configuration of FIG. 3 is identical to that of FIG. 2, with the exception of the geometry of the grooves 122. In this example, the grooves 122 form a non-perpendicular angle with one of the outer surfaces 126, 128, 130, 132. Moreover, the sidewalls of the grooves form a non-perpendicular intersection with one another.

The embodiments of FIGS. 3-4 illustrate two specific examples of a wide variety of groove configurations. More generally, the location, geometry and number of grooves 122 may vary from what is shown. Design considerations that may impact the location, geometry and number of grooves 122 include considerations related to processing techniques to be described below, such as material properties of the mold compound the forms the encapsulant body, material properties of the plating material, and the type of the punch used to remove the dam bars 114.

The above discussed groove configuration may be replicated in other leads of the lead frame 100. In the depicted lead frame 100, the second and third leads 108, 110 may have any groove configuration described herein, and may have the same cross-sectional configuration as shown in FIG. 3 or 4.

Referring to FIGS. 5-9, selected method steps for producing a semiconductor package using the lead frame 100 are depicted, according to an embodiment. The lead frame 100 can placed on a temporary carrier (not shown) and moved through various semiconductor processing tools for performing the steps described herein. Additionally, or alternatively, the lead frame 100 can be handled using the peripheral structure 112 and moved through various semiconductor processing tools for performing the steps described herein.

Figure 5:
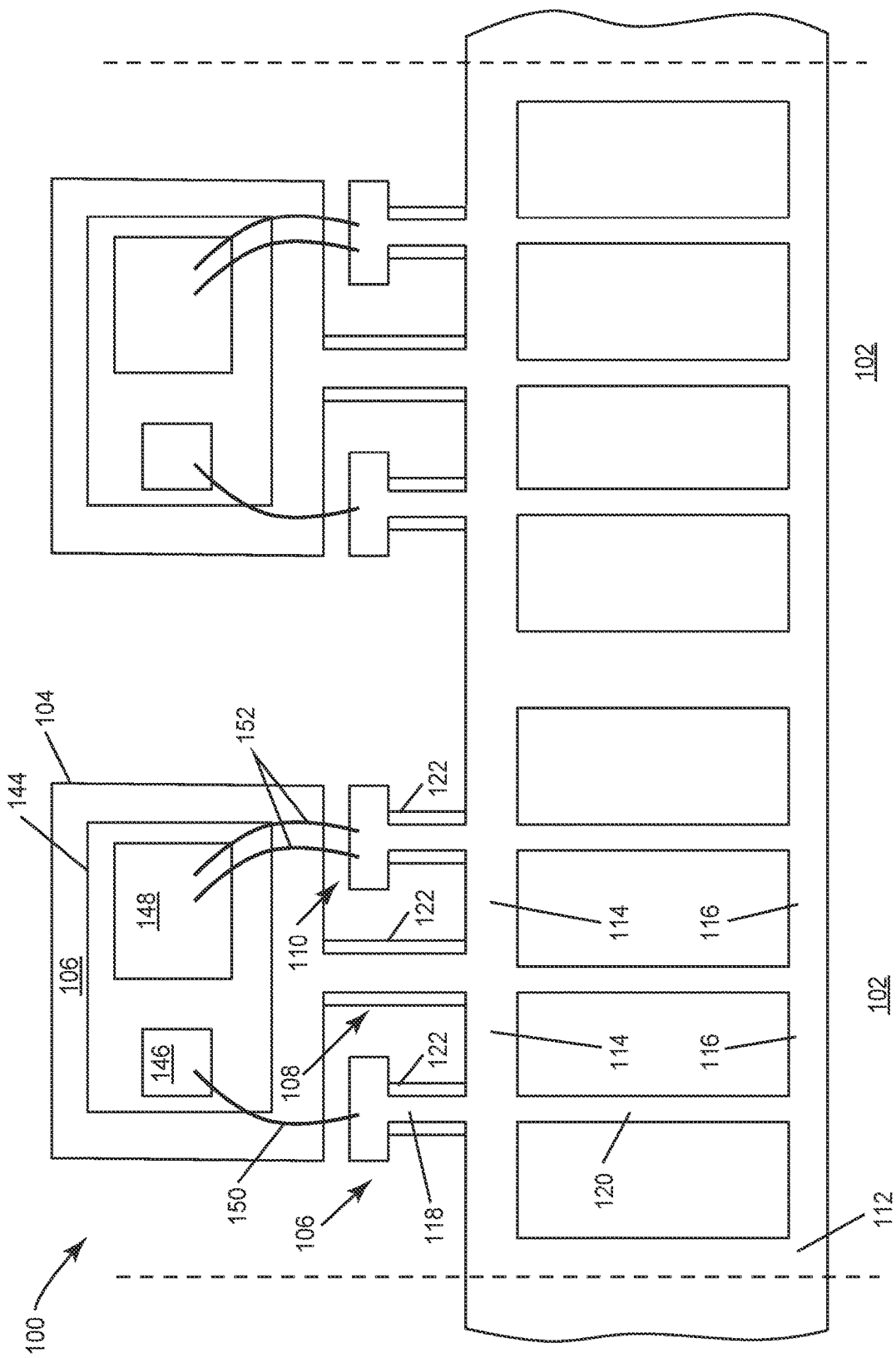
FIG. 5 illustrates a process step of mounting a semiconductor die on the lead frame, according to an embodiment.

Referring to FIG. 5, a semiconductor die 144 is mounted on the die attach surface 105 of the die pad 104. This can be done by providing an adhesive, e.g., solder, sinter, tape, etc., between the lower side of the semiconductor die 144 and the die pad 104. Subsequently, electrical connections are provided between terminals of the semiconductor die 144 and at least some of the leads from the lead frame 100. Generally speaking, these electrical connections can be provided by conventionally known connection features, such as bond wires, clips, ribbon. etc. In the depicted embodiment, the semiconductor die 144 includes a first conductive bond pad 146 that provides a first terminal, and a second conductive bond pad 148 that provides a second terminal. The first conductive bond pad is electrically connected to the first lead 106 by a single bond wire 150, and the second conductive bond pad is electrically connected to the third lead by two bond wires 152. The semiconductor die 144 additionally includes a third conductive bond pad (not shown) that provides a third terminal on the lower side of the semiconductor die 144. The third conductive bond pad is electrically connected to the second lead 108 via the die pad 104 and the conductive interface between the semiconductor die 144 and the die pad 104.

According to an embodiment, the semiconductor die 144 is configured as a power device, i.e., a device that is configured to block large voltages, e.g., 200 volts or more, and/or accommodate large currents, e.g., 1 ampere or more.

For example, the semiconductor can be configured as a power transistor, such as a MOSFET (Metal Oxide Semiconductor Field Effect Transistors) or Insulated Gate Bipolar Transistor (IGBT) wherein the first terminal is a gate terminal, the second terminal is a drain or collector terminal, and the third terminal is a source or emitter terminal.

More generally, the semiconductor die 144 can have any of a wide variety of device configurations. These device configurations include discrete devices such as HEMT (high electron mobility transistor) devices, diodes, thyristors, etc. These device configurations also include integrated devices such as, controllers, amplifiers, etc. These device configurations include vertical device configurations, i.e., devices which conduct in a direction perpendicular to the upper and lower surfaces of the die, and lateral device configurations, i.e., devices which conduct in a direction parallel to the upper and lower surfaces of the die. The lead frame 100 may be suitably adapted to include the appropriate number and configuration of leads for any one of these device configurations.

Figure 6:
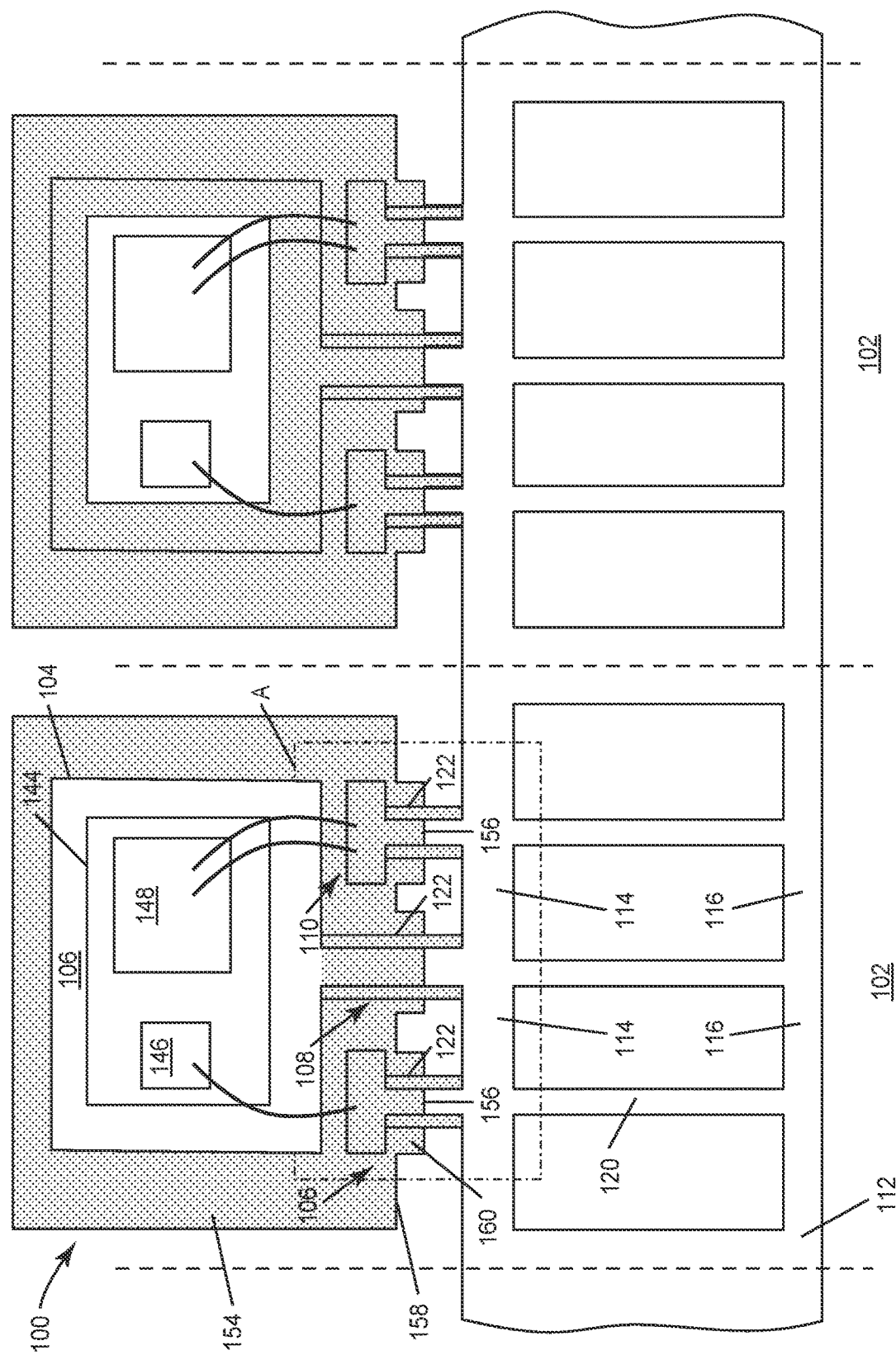
FIG. 6 illustrates a process step of encapsulating a semiconductor die on the lead frame, according to an embodiment.

Referring to FIG. 6, an encapsulation process is performed to form an electrically insulating encapsulant body 154 on the lead frame 100. The encapsulant body 154 is shown as translucent in FIG. 6 so that the encapsulated components are visible in the figure. In practice however this material is typically opaque. The encapsulant body 154 is formed to completely encapsulate, i.e., cover and surround, the semiconductor die 144 and associated electrical connections between the terminals of the semiconductor die 144 and the leads. The encapsulant body 154 can include a wide variety of electrically insulating materials such as ceramics, epoxy materials and thermosetting plastics, to name a few.

According to an embodiment, the encapsulant body 154 is formed by a molding process. According to this technique, a mold tool is placed on the lead frame 100 such that the semiconductor die 144 is contained within a cavity of the mold tool. The cavity is then filled with liquified molding material, e.g., a thermosetting plastic. The molding material may be placed in a liquefied state through some combination of heat and/or pressure. Once the mold cavity is filled, the liquified molding material is subsequently hardened. Subsequently, the mold tool is removed. Examples of these techniques include injection molding, transfer molding, compression molding, etc. In any of these techniques, the mold cavity is arranged to form the encapsulant body 154 with an outer sidewall 156 that intersects the leads at a location that is between the inner dam bars 114 and the die pad 104. This outer sidewall 156 is disposed over and extends transversely to the grooves 122.

The encapsulant body 154 is formed such that the semiconductor die 144 and at least part of the inner portions 118 of the leads 106, 108, 110 are encapsulated by the encapsulant body 154, and the outer portions 120 of the leads 106, 108, 110 are exposed from the encapsulant body 154. At least part of the longitudinal sections of the leads 106, 108, 110 that include the grooves 122 protrude out of a sidewall 156 of the encapsulant body 154. In the depicted embodiment, the encapsulant body 154 is formed to include a main volume that is defined by an outer wall 158 that extends between an upper surface of the encapsulant body 154 that is over the die pad 104, and a lower surface of the encapsulant body 154 that is at or below the die pad 104. As shown, the encapsulant body 154 is configured to include lead sleeves 160 that cover and surround each of the leads 106, 108, 110. The lead sleeves 160 protrude out from the main volume portion of the encapsulant body 154, and the longitudinal sections of the leads 106, 108, 110 that includes the grooves 122 protrude out of a sidewall 156 of the lead sleeves. Alternatively, the lead sleeves 160 may be omitted. In that case, the longitudinal sections of the leads 106, 108, 110 that includes the grooves 122 may protrude out of the outer wall 158 of the main volume portion of the encapsulant body 154.

Figure 7:
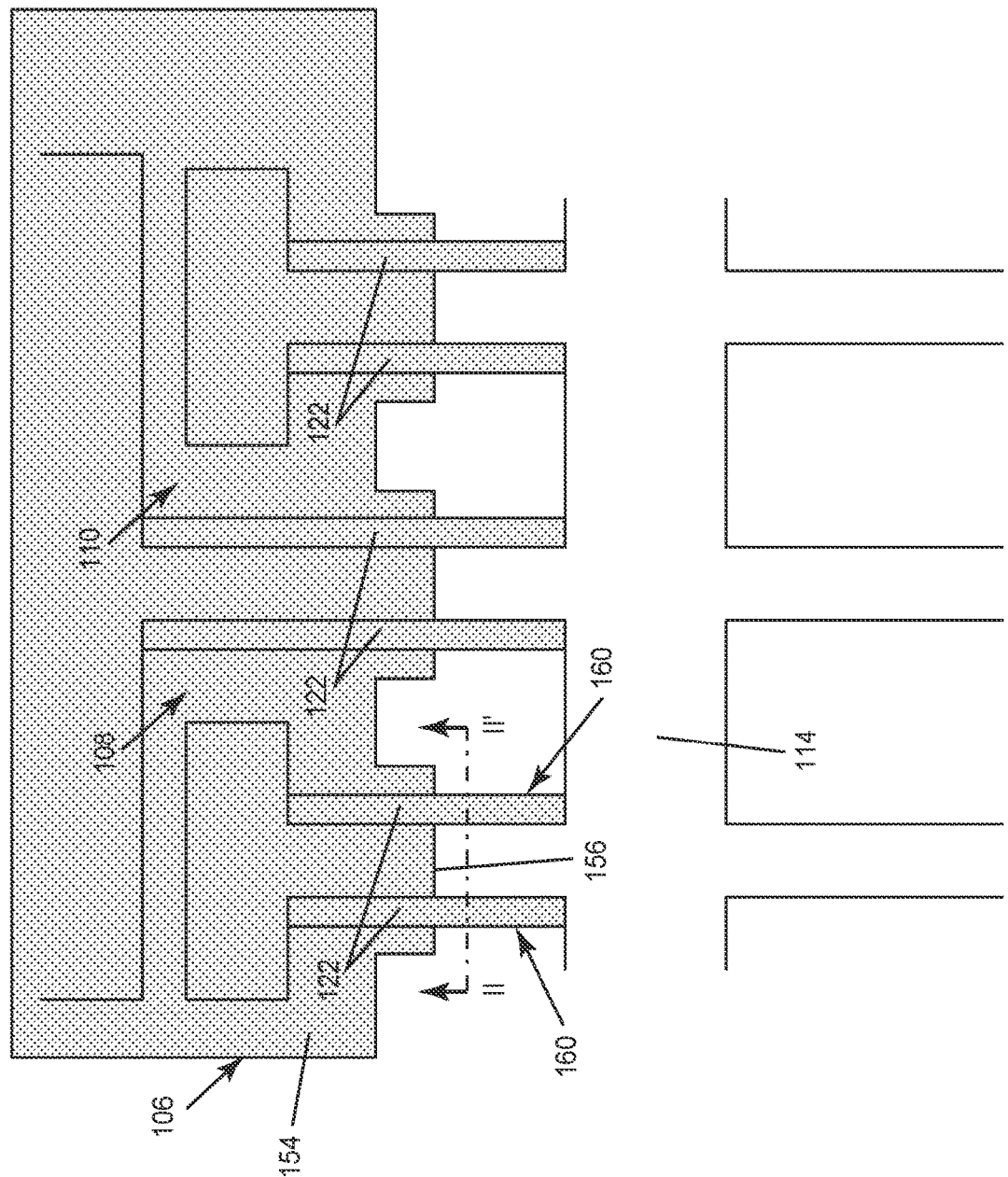
FIG. 7 illustrates a close-up view of the lead frame in the area A identified in FIG. 6, according to an embodiment.
Figure 8:
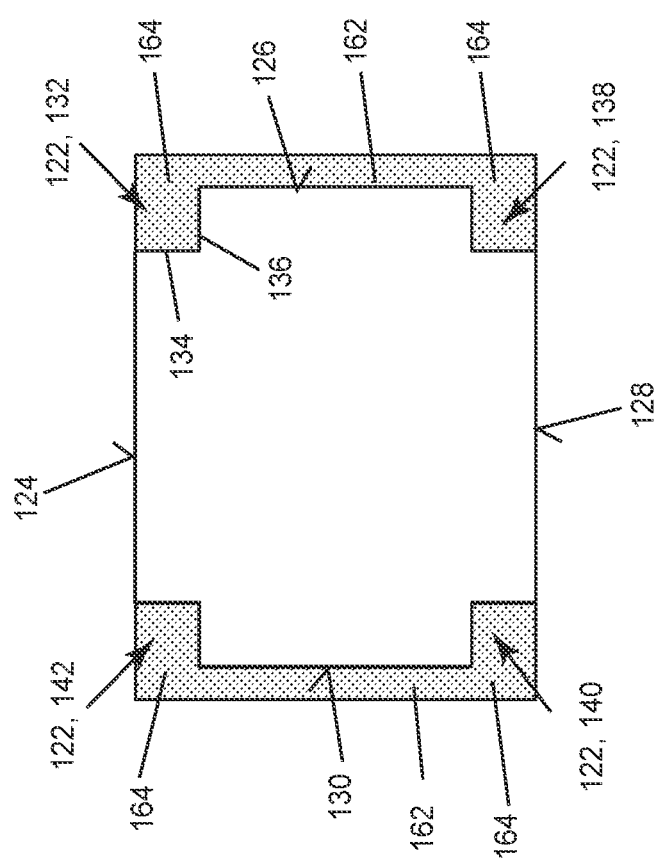
FIG. 8 illustrates a cross-sectional view of the lead frame along the line II-II' identified in FIG. 7, according to an embodiment.

Referring to FIGS. 7 and 8, the impact of the grooves 122 on the molding process is depicted. Due to minor variations in the geometry of the mold tool and/or the lead frame, the leads may not be completely sealed by the mold tool. As a result, a small amount of liquified mold compound may escape the mold cavity during the molding process.

The grooves 122 provide a channel for liquified mold compound escaping the mold cavity to accumulate. That is, the grooves 122 provide a region for mold compound overflow. This excess mold compound forms along the grooves 122 between the outer sidewall 156 of the encapsulant body 154 and the inner dam bar 114. As shown, a relatively thinner layer 162 of mold compound that extends along the second and fourth sidewalls 126, 140, and a relatively thicker region 164 of mold compound forms in each of the grooves 122. This relatively thinner layer 162 may or may not be present, depending on the tolerances of the molding tool. In any case, the grooves 122 receive a substantial majority, if not all, of the excess mold compound.

Figure 9:
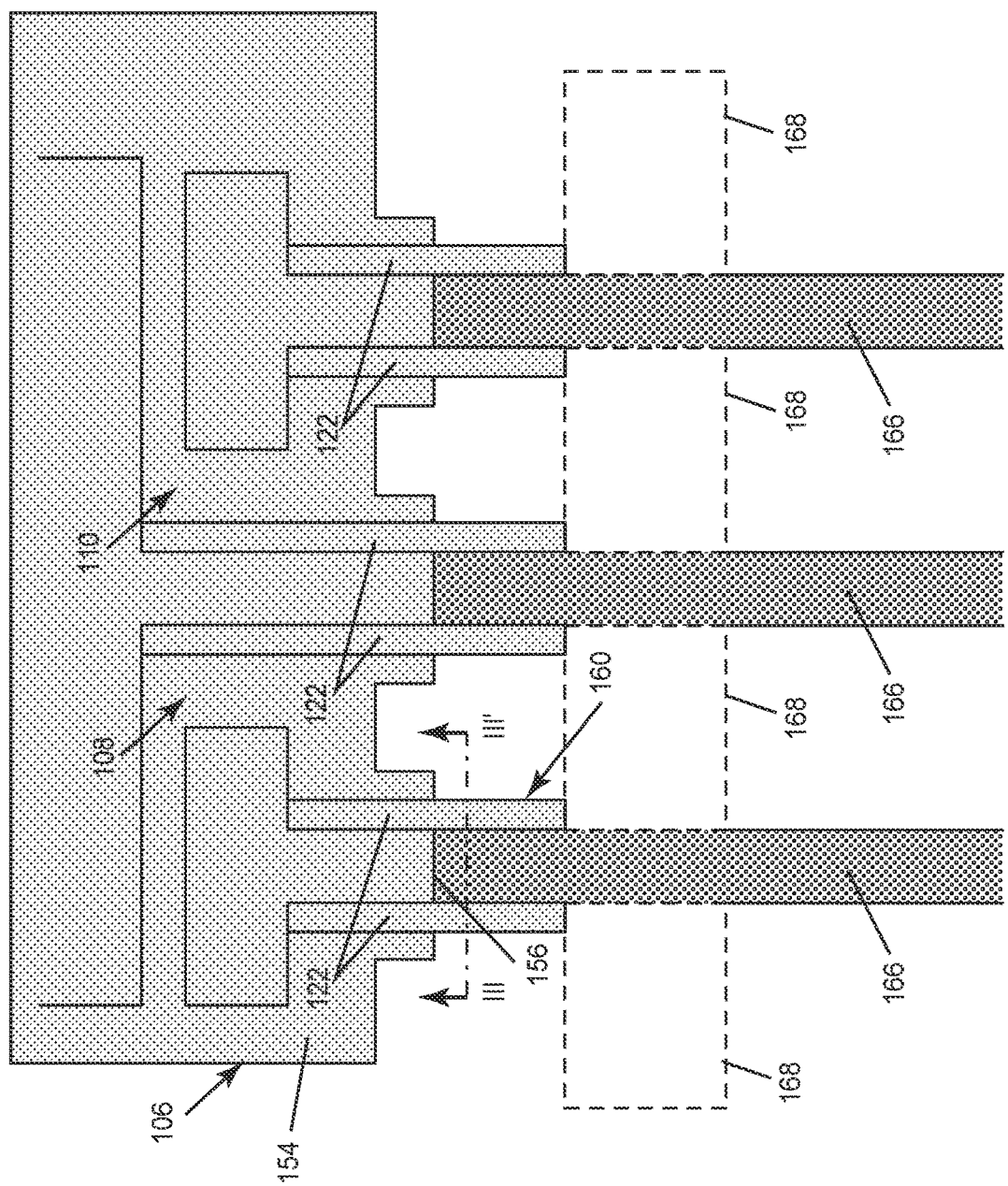
FIG. 9 illustrates process steps of forming a plating on the leads and removing dam bars from the lead frame, according to an embodiment.

Referring to FIG. 9, further processing steps are performed on the device after the encapsulation process. In particular, a plating process has been performed. The plating process coats the exposed surface of the leads with a conductive plating 166. The conductive plating 166 may be used to enhance the electrical connectivity of the leads and/or protect the surface of the leads. The conductive plating 166 may include conductive metals, e.g., copper, aluminum, silver, tin, zinc, etc., and alloys thereof. In one particular embodiment, the conductive plating 166 includes a solder material (e.g., tin based solder) with a lower melting point than the material of the underlying lead. The conductive plating 166 can be formed according to a variety of metal plating techniques such as electroplating, electroless plating, etc., wherein the conductive lead provides a seed for the formation of a conductor thereon.

After the plating process is performed, the inner dam bars 114 are removed. At least the inner dam bars 114 may be removed by a punching process. According to this technique, a punch is placed in the outlined area 168 and forced downward to mechanically detach the inner dam bars 114. The lead frame rails 116 may be removed by the same or a different technique. As a result, the first, second and third leads 106, 108, 110 are mechanically detached from one another, and a completed semiconductor package is provided.

Figure 10:
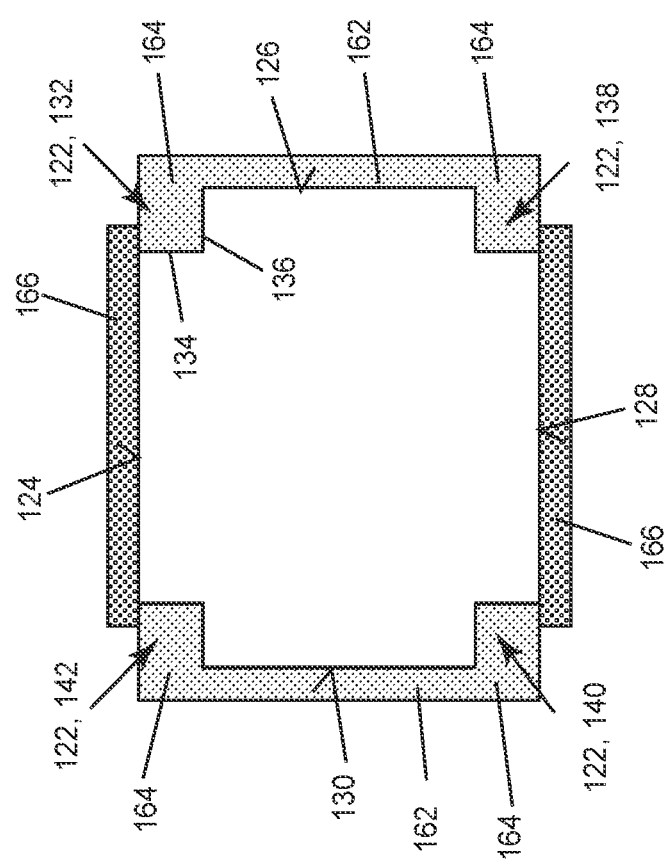
FIG. 10 illustrates a cross-sectional view of the lead frame along the line III-III' identified in FIG. 9, according to an embodiment.

Referring to FIG. 10, a side view of the first lead 106 is shown. As can be seen, the conductive plating 166 forms on the upper and lower sides of the first lead 106, i.e., the first and third surfaces 124, 128 but does not extend to the lateral boundaries of the lead, i.e., the plane of the second and fourth surfaces 126, 130. Because the mold compound is electrically insulative, the conductive plating 166 does not form on the mold compound in the above described plating techniques. The groove configuration advantageously increases the lateral separation distance between the conductive plating 166 and the lateral boundaries of the lead. Put another way, the lead design according to the embodiments described herein produces a buffer between the conductive plating 166 and the lateral boundaries of the lead. By way of comparison, a lead design that does not include the grooves 122 results in a thin layer of mold compound along the sidewalls of the lead, and a conductive plating that comes very close to the lateral boundaries of the lead. The increased lateral buffer between the conductive plating 166 and the lateral boundaries of the lead means that the punch is less likely to contact the plating material in the above described punching process. Moreover, the mold compound is susceptible to cracking, due to the engagement of the grooves 122 with the mold compound. This mitigates or eliminates the possibility of tearing the conductive plating 166 into fritters that protrude away from the lead. As a result, the possibility of electrical shorts is decreased.

By forming the grooves 122 on the leads and filling the grooves with mold compound, the risk of the punching machine that removes tie bars between the leads additionally punching the plating layer formed on these leads is reduced. Thus, the possibility of generating a conductive fritter from the plating layers is reduced.

The term "substantially" encompasses absolute conformity with a requirement as well as minor deviation from absolute conformity with the requirement due to manufacturing process variations, assembly, and other factors that may cause a deviation from the ideal. Provided that the deviation is within process tolerances so as to achieve practical conformity and the components described herein are able to function according to the application requirements, the term "substantially" encompasses any of these deviations.

The term "generally planar" as used herein refers to a surface that substantially extends along a single plane.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A lead frame, comprising:
   a die pad;
   a first lead extending away from the die pad;
   a peripheral structure mechanically connected to the first lead and the die pad;
   a first groove in an outer surface of the first lead, the first groove extending longitudinally along the first lead away from the die pad;
   a second lead extending away from the die pad; and
   a fifth groove in an outer surface of the second lead, the fifth groove extending longitudinally along the second lead away from the die pad,
   wherein the first and second leads are immediately adjacent leads of the lead frame, wherein the outer surface of the first lead comprises first and second surfaces that are generally planar and extend longitudinally along the first lead, wherein the first and second surfaces are angled relative to one another, and wherein the first groove forms a transition between the first and second surfaces.

2. The lead frame of claim 1, wherein the outer surface of the first lead further comprises a third surface that is generally planar and extends longitudinally along the first lead, wherein the second and third surfaces are angled relative to one another, wherein the lead frame further comprises a second groove in an outer surface of the first lead, the second groove extending longitudinally along the first lead away from the die pad, and wherein the second groove forms a transition between the second and third surfaces.

3. The lead frame of claim 2, wherein the outer surface of the first lead further comprises a fourth surface that is generally planar and extends longitudinally along the first lead, wherein the third and fourth surfaces are angled relative to one another, wherein the fourth and first surfaces are angled relative to one another, wherein the lead frame further comprises a third and fourth grooves in an outer surface of the first lead, the third and fourth grooves extending longitudinally along the first lead, wherein the third groove forms a transition between the third and fourth surfaces, and wherein the fourth groove forms a transition between the fourth and first surfaces.

4. The lead frame of claim 1, wherein the peripheral structure comprises an inner dam bar that extends transversely to and connects with longitudinal edge sides of the first and second leads, and wherein the first and fifth grooves longitudinally extend between the inner dam bar and a location that is closer to the die pad.

5. The lead frame of claim 4, wherein the peripheral structure comprises a lead frame rail that extends transversely to and connects with longitudinal edge sides of the first and second leads, wherein the lead frame rail is further away from the die pad than the inner dam bar, wherein inner portions of the leads disposed between the die pad and the inner dam bars have a first thickness, and wherein outer portions disposed between the inner dam bars and the lead frame rails have a second thickness that is less than the first thickness.

6. A method of packaging a semiconductor device, the method comprising:
providing a lead frame that comprises:
a die pad;
a first lead and extending away from the die pad;
a peripheral structure mechanically connected to the first lead and the die pad;
a first groove in an outer surface of the first lead, the first groove extending longitudinally along the first lead away from the die pad;
a second lead extending away from the die pad; and
a fifth groove in an outer surface of the second lead, the fifth groove extending longitudinally along the second lead away from the die pad,
wherein the first and second leads are immediately adjacent leads of the lead frame, and
wherein the outer surface of the first lead comprises first and second surfaces that are generally planar and extend longitudinally along the first lead, wherein the first and second surfaces are angled relative to one another, and wherein the first groove forms a transition between the first and second surfaces.

7. The method of claim 6, further comprising:
mounting a semiconductor die on the die pad; and
encapsulating the semiconductor die with an electrically insulating encapsulant body, and
wherein the electrically insulating encapsulant body is formed such that an outer sidewall that is disposed over an extends transversely to the first groove.

8. The method of claim 7, wherein the peripheral structure comprises an inner dam bar that extends transversely to and connects with longitudinal edge sides of the first and second leads, wherein the first and fifth grooves longitudinally extend between the inner dam bar and a location that is closer to the die pad, and wherein the outer sidewall intersects the first and second leads at a location that is between the inner dam bars and the die pad.

9. The method of claim 8, wherein encapsulating the semiconductor die comprises a molding process, and wherein the molding process forms mold compound that extends past the outer sidewall of the encapsulant body and towards the inner dam bars in the first and fifth grooves.

10. The method of claim 9, further comprising:
performing a plating process that covers upper surfaces of the first and second leads with a conductive plating material after the molding process; and
performing a punching process that removes the inner dam bar after performing the plating process.

11. The method of claim 10, wherein the first and fifth grooves substantially prevent the conductive plating formed on the first and second leads from reaching lateral outer sides of the first and second leads during the plating process.

12. A semiconductor package, comprising:
a die pad;
a first lead that extends away from the die pad and comprises a first groove in an outer surface of the first lead, the first groove extending longitudinally along the first lead away from the die pad;
a semiconductor die mounted on the die pad; and
an encapsulant body of electrically insulating mold compound that is formed, such that:
the semiconductor die and an inner portion of the first lead are encapsulated by the encapsulant body;
an outer portion of the first lead is exposed from the encapsulant body; and
a longitudinal section of the first lead that includes the first groove protrudes out of an outer sidewall of the encapsulant body,
wherein the outer surface of the first lead comprises first and second surfaces that are generally planar and extend longitudinally along the first lead, wherein the first and second surfaces are angled relative to one another, and wherein the first groove forms a transition between the first and second surfaces.

13. The semiconductor package of claim 12, wherein the encapsulant body comprises a main volume and a lead sleeve, wherein the lead sleeve extends out of the edge side of the main volume and completely surrounds the first lead, and wherein the longitudinal section of the first lead protrudes out of the lead sleeve.

14. The semiconductor package of claim 12, wherein the encapsulant body comprises a main volume comprising a substantially planar edge side that extends between upper and lower surfaces, and wherein the longitudinal section of the lead protrudes directly out of the planar edge side.

15. The semiconductor package of claim 12, wherein a portion of the mold compound is formed outside of the outer sidewall in the first groove.

16. The semiconductor package of claim 12, wherein the outer surface of the first lead further comprises a second groove in an outer surface of the first lead, the second groove extending longitudinally along the first lead away from the die pad, wherein the first and second grooves are separated from one another by the second surface, wherein a portion of the mold compound is formed outside of the outer sidewall in the first and second grooves, and wherein the second surface that is outside of the outer sidewall is substantially devoid of the mold compound.

17. A lead frame, comprising:
a die pad;
a first lead extending away from the die pad;
a peripheral structure mechanically connected to the first lead and the die pad;
a first groove in an outer surface of the first lead, the first groove extending longitudinally along the first lead away from the die pad;
a second lead extending away from the die pad; and
a fifth groove in an outer surface of the second lead, the fifth groove extending longitudinally along the second lead away from the die pad,
wherein the first and second leads are immediately adjacent leads of the lead frame, and
wherein the groove comprises first and second sidewalls that extend into the first lead, and wherein the first and second sidewalls form an angled intersection with one another.

* * * * *